United States Patent
Okuno et al.

[11] Patent Number: 6,111,418
[45] Date of Patent: Aug. 29, 2000

[54] METHOD FOR BUILDING AND A STRUCTURE OF A CONTACT END IN A CONTACT PROBE

[75] Inventors: Toshio Okuno, Yokohama; Hiroshi Katakawa, Kawasaki; Narutoshi Kobashi; Kenichi Okamoto, both of Yokohama, all of Japan

[73] Assignee: Soshotech Co., Ltd., Kanagawa-Ken, Japan

[21] Appl. No.: 09/026,124

[22] Filed: Feb. 19, 1998

[30] Foreign Application Priority Data

Feb. 20, 1997 [JP] Japan ................................ 9-036583

[51] Int. Cl.[7] .................................................. G01R 31/02
[52] U.S. Cl. ........................... 324/754; 324/761; 324/762
[58] Field of Search ................................... 324/754, 761, 324/762, 72.5

[56] References Cited

U.S. PATENT DOCUMENTS

| | | | |
|---|---|---|---|
| 5,061,894 | 10/1991 | Ikeda | 324/754 |
| 5,211,895 | 5/1993 | Janko et al. | |
| 5,221,895 | 6/1993 | Janko et al. | 324/762 |
| 5,521,518 | 5/1996 | Higgins | 324/754 |
| 5,621,333 | 4/1997 | Long et al. | 324/762 |

FOREIGN PATENT DOCUMENTS

| | | |
|---|---|---|
| 62-56864 | 3/1987 | Japan . |
| 1-147374 | 6/1989 | Japan . |
| 1-211936 | 8/1989 | Japan . |
| 4-363671 | 12/1992 | Japan . |
| 7-211752 | 8/1996 | Japan . |

*Primary Examiner*—Safet Metjahic
*Assistant Examiner*—T. R. Sundaram
*Attorney, Agent, or Firm*—Wenderoth, Lind & Ponack, L.L.P.

[57] ABSTRACT

In the contact probe 1 having an array of leads 3 densely attached to a surface of an insulative film 2, pressure contact ends are formed by one end of the leads 3 being arranged in an array along one end edge portion of the insulative film 3. Slots are formed in the one end edge portion of the insulative film 2 such that the slots 9 are open between adjacent contact ends. When the lead ends arranged in the array on the surface of the insulative film are contacted under pressure with a given electronic part, a sufficient degree of freedom of flexure of the contact ends is obtained, so that the contact ends are contacted under pressure with the external terminals of the electronic part.

13 Claims, 7 Drawing Sheets ary of the Invention

METHOD FOR BUILDING AND A STRUCTURE OF A CONTACT END IN A CONTACT PROBE

BACKGROUND OF THE INVENTION

1. Technical Field of the Invention

This invention relates to a contact probe which is brought, under pressure, into contact with a given electronic part of a liquid crystal display device, or the like, and more particularly to a structure of a pressure contact end of the contact probe.

2. Description of the Related Art

In the test of a liquid crystal display device, or the like, one end of the contact probe is brought, under pressure, into contact with an electrode pad of the display device and the other end thereof is connected to a testing instrument to be used for input/output of signal.

As shown in FIGS. 1, 2 and 3, a typical contact probe 1 includes an array of leads 3 arranged in great density on a surface of an insulative film 2. Such a contact probe 1 is bonded to a rigid block 4 through the insulative film 2. One end of the contact probe 1 projects from an end edge of the rigid block 4 to form contact ends 7 so as to be contacted, under pressure, with electrode pads 6 of a liquid crystal display device 5, respectively. The leads 3 are formed, for example, by growing a starting material so as to have a predetermined thickness through plating.

In the contact probe 1, each contact end 7 is restricted by the insulative film 2 to ensure an orderly arrangement (pitch) and to obtain a degree of freedom of flexure for each contact end 7 required by the flexibility of the insulative film 2. The effective width of the insulative film 2 existing between the adjacent contact ends 7 due to an increasingly smaller pitch arrangement of the leads 3, the expected degree of freedom of flexure of the leads 3 at the insulative film portion between the adjacent contact ends 7 is reduced by the pitch of the leads 3.

As shown in FIG. 3, for example, in the situation where foreign matter exists on a surface of one of the electrode pads 6, the film between the adjacent contact ends 7 acts as a rigid material because the pitch between the adjacent leads 3 is very small and as a result, not only the contact end corresponding to the electrode pad 6 on which the foreign matter exists, but also the contact ends corresponding to the electrode pads 6 adjacent to the first-mentioned electrode pad 6 fail to touch the electrode pads 6 despite the attempt to press the contact ends 7 against the corresponding electrode pads 6. The result is that the contact ends cannot contact the corresponding electrode pads 6. This prevents the contact probe from performing its function.

SUMMARY OF THE INVENTION

The present invention aims to increase the degree of freedom of the vertical displacement of the contact ends that occurs with contact and to obtain a reliable contact relationship under pressure.

As a means for achieving the above object, the contact ends 7 of the leads 3 are located on a surface of one end edge portion of the insulative film 2, or are projected from one end edge of the insulative film 2 and a slot is formed in the one end edge portion of the insulative film 2 such that the slot is open between adjacent contact ends 7, while restraining the insulative film 2 with the contact ends 7, thereby ensuring the required degree of freedom of the vertical displacement needed for pressure contact.

According to the present invention, a reliable electrical contact can be obtained between the leads and a given electronic part by orderly arranging the contact ends of the leads with the insulative film and fully ensuring the degree of flexure of the contact ends with the slot.

DETAILED DESCRIPTION OF THE INVENTION

Embodiments of the present invention will be described hereinafter with reference to FIGS. 4A to 10.

Figure 4A:
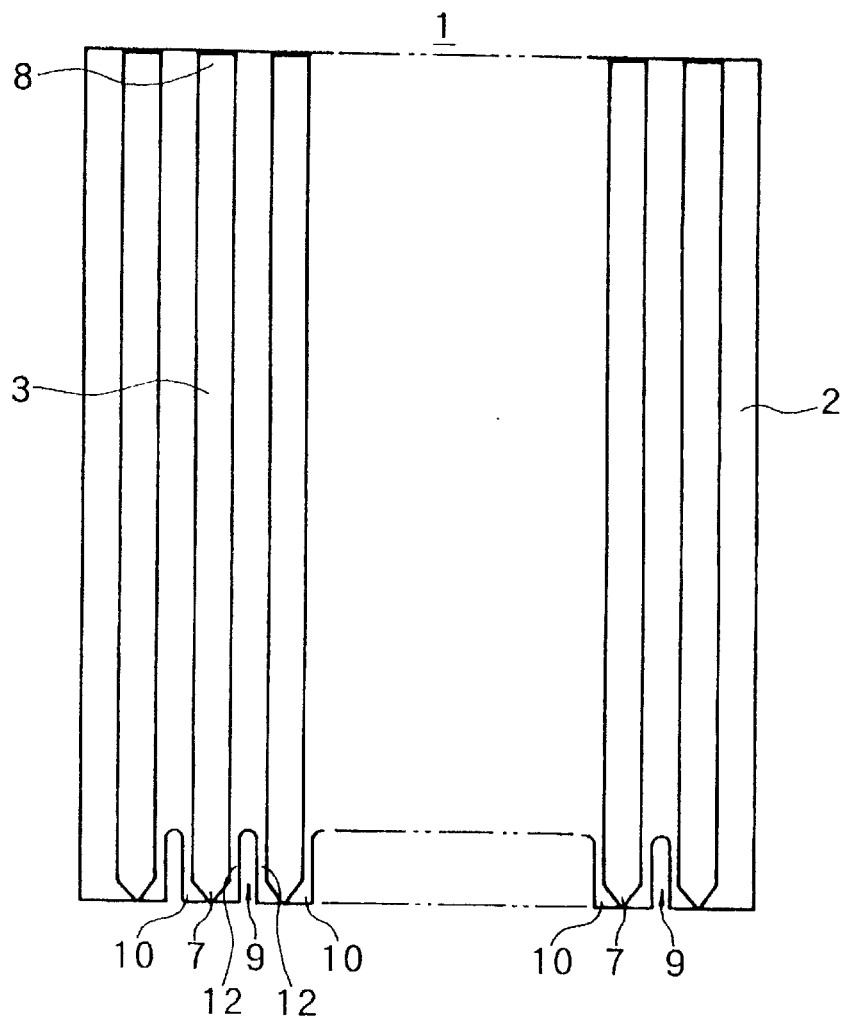
FIG. 4A is a plan view of a contact probe according to one embodiment of the present invention.
Figure 5A:
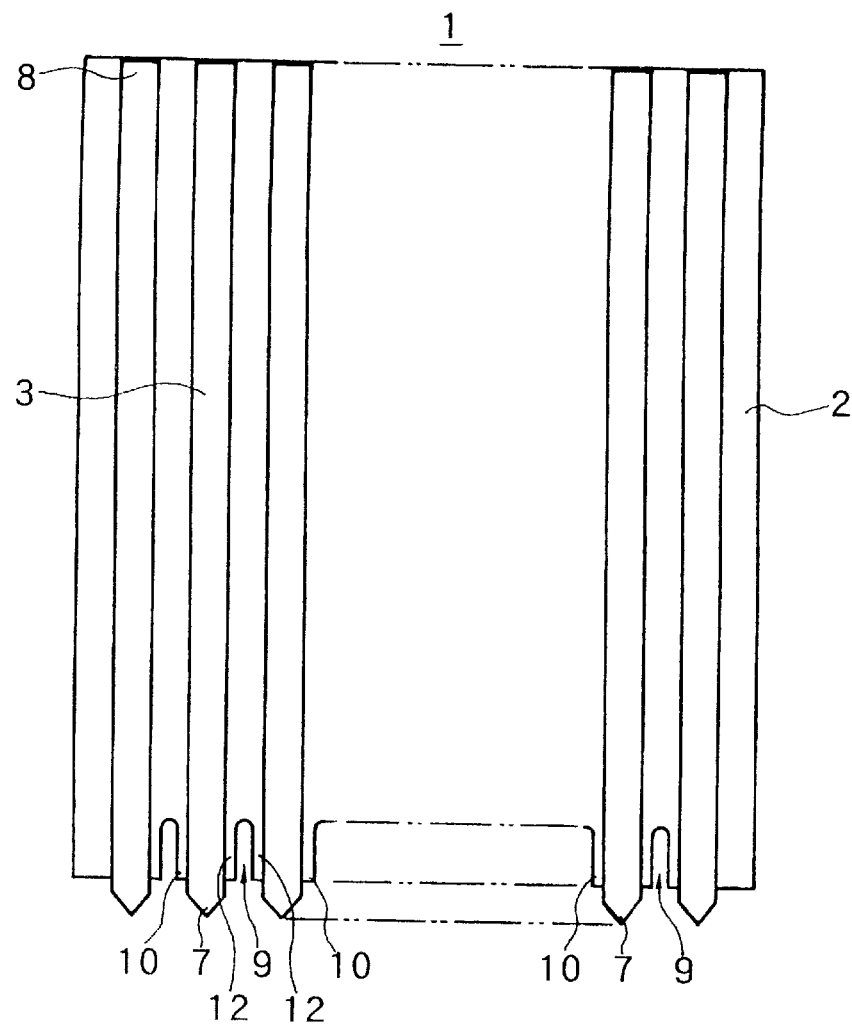
FIG. 5A is a plan view of a contact probe according to another embodiment of the present invention.

As shown in FIGS. 4A and 5A, leads 3 constituting a contact probe 1 are arranged in an array with small pitches on a surface of an insulative film 2 and are integrally attached to the film 2. The leads 3 extend in an array from one end edge to the other end edge opposing thereto of the square insulative film 2. These leads 3 are formed, for example, by plating growth or by blanking a thin plate.

One set of ends of the leads 3 form pressure contact ends 7 to be contacted with terminals of a given electronic part represented by electrode pads of a liquid crystal display device, and the other set of ends thereof form connection ends 8 by soldering or the like and are connected a testing device or the like. The contact ends 7 are arranged in a row along one end edge of the insulative film 2. As shown in FIG. 4A, the contact ends 7, as a whole, are backed by the insulative film 2 with the contact ends 7 placed on the surface of one end edge portion of the insulative film 2. For orderly arrangement, the contact ends 7 are restricted by the other end edge of the insulative film 2.

Also, as shown in FIG. 5A, the contact ends 7 can project from the one end edge of the insulative film 2 so that the contact ends 7 are restricted by the other end edge of the insulative film 2 for orderly arrangement. At the same time, flexibility of the insulative film 2 makes it possible for the contact ends 7 to flex upwardly and downwardly when they are contacted under pressure with the electrode pads. However, the degree of freedom of flexure of the contact ends 7 is limited by the width of the insulative film existing between the adjacent leads 3. This degree of freedom of flexure is reduced as the pitch of the leads 3 is reduced.

As a means for solving this problem, as shown in FIG. 4A, slots 9 are formed in the one end edge portion of the insulative film 2 such that the slots 9 are open between the adjacent pressure contact ends 7 which are placed on the surface of the one end edge portion of the insulative film 2. As shown in FIG. 5A, it is also an interesting alternative that slots 9 are formed in the one end edge portion of the insulative film 2 such that the slots 9 are open between the adjacent pressure contact ends 7 which project from the one end edge of the insulative film 2. In either case, the pressure contact ends 7 are restricted by the other end edge of the insulative film 2 so that pitches are prevented from being displaced and an orderly arrangement is ensured. In the case of FIG. 5A, the contact ends 7 are backed with and reinforced by comb tooth like insulative film elements 10 existing between the adjacent slots 9.

Figure 1:
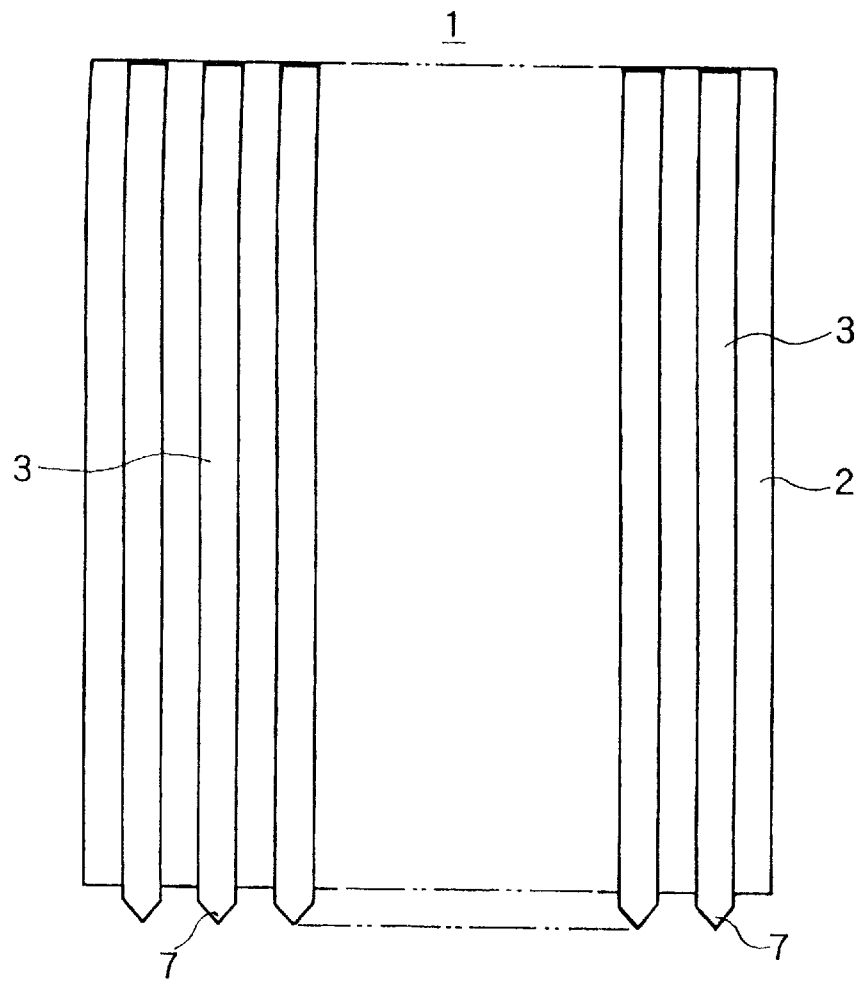
FIG. 1 is a plan view of a conventional contact probe.
Figure 2:
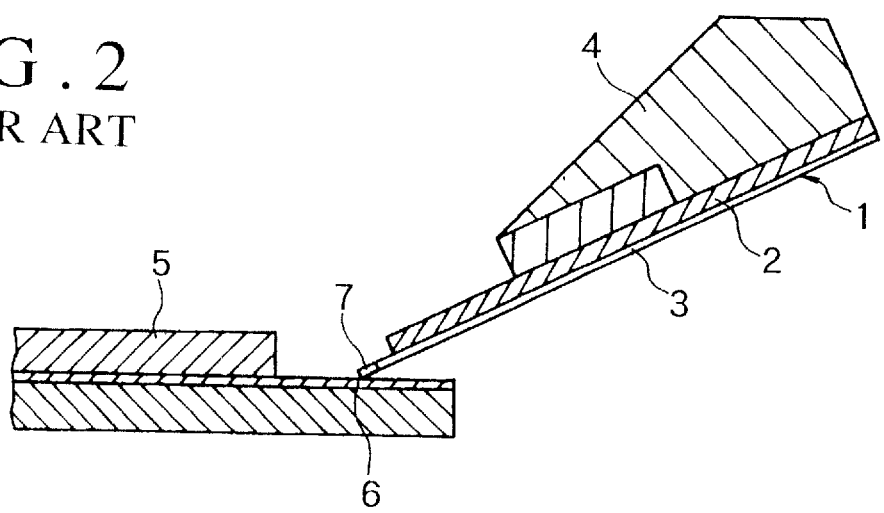
FIG. 2 is a vertical sectional view of a contactor in which the above contact probe is used.
Figure 3:
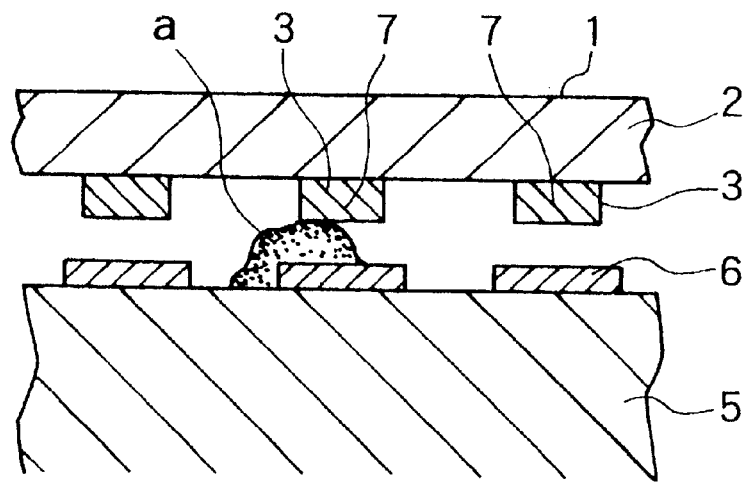
FIG. 3 is a cross sectional view showing a contacting state when foreign matter exits on one of the pressure contact ends of the above contact probe.
Figure 4B:
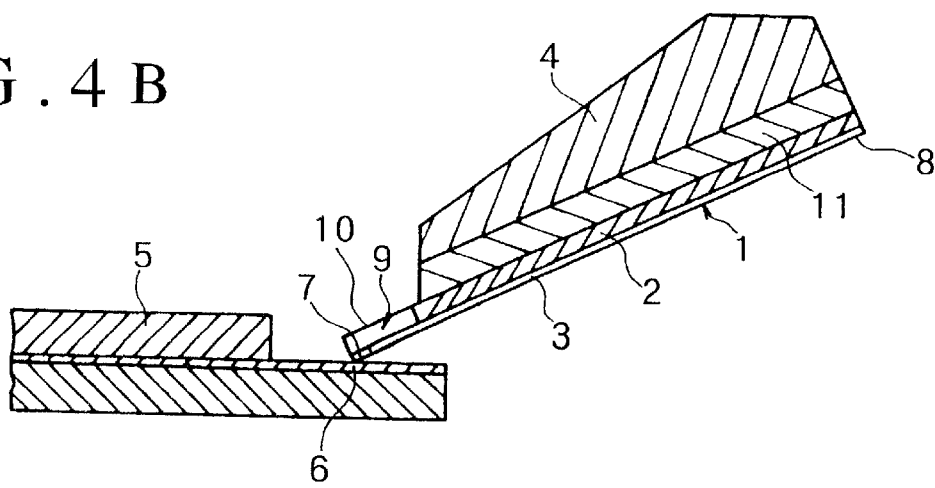
FIG. 4B is a vertical sectional view of a contactor formed by using this contact probe.
Figure 5B:
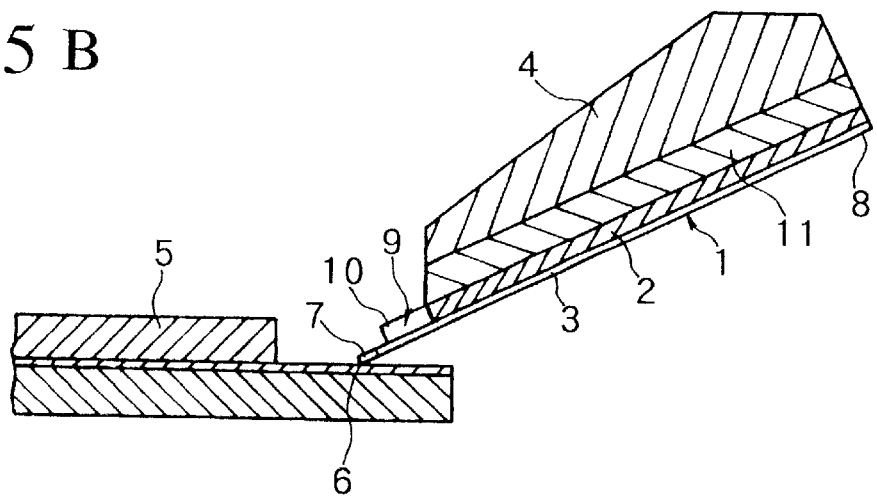
FIG. 5B is a vertical sectional view of a contactor formed by using this contact probe.

In addition, because the contact ends 7 of the leads 3 and the insulative film elements 10 are isolated from each other by the slots 9, they can flex upwardly and downwardly (in a direction of the thickness of the leads) in an independent manner. In the contact probe 1 shown in FIGS. 4A and 5A, the insulative film 2 is bonded, either directly or through a resilient sheet 11, to a rigid block 4 with the contact ends 7 and the slots 9 projecting beyond the end edge of the rigid block 4 as shown in FIGS. 4B and 5B, so that each contact end 7 contacts, under pressure, with the surface of each electrode pad 6 of the liquid crystal display device of FIG. 2. At the time of such pressure contact, the degree of freedom of flexure of the contact ends 7 which are isolated by each slot 9 is fully ensured.

Occasionally, situations occur where erroneous differences exist between the adjacent leads 3 and the adjacent electronic pads 6. The erroneous differences occur particularly by plating growth or the like and these erroneous differences make it difficult to obtain a uniform pressure contact between the contact ends 7 and the electrode pads 6. The above slots 8 fully ensure the degree of freedom of flexure of the contact ends 7 so that the contact ends 7 can all be uniformly contacted, under pressure, with their corresponding electrode pads 6.

Figure 7:
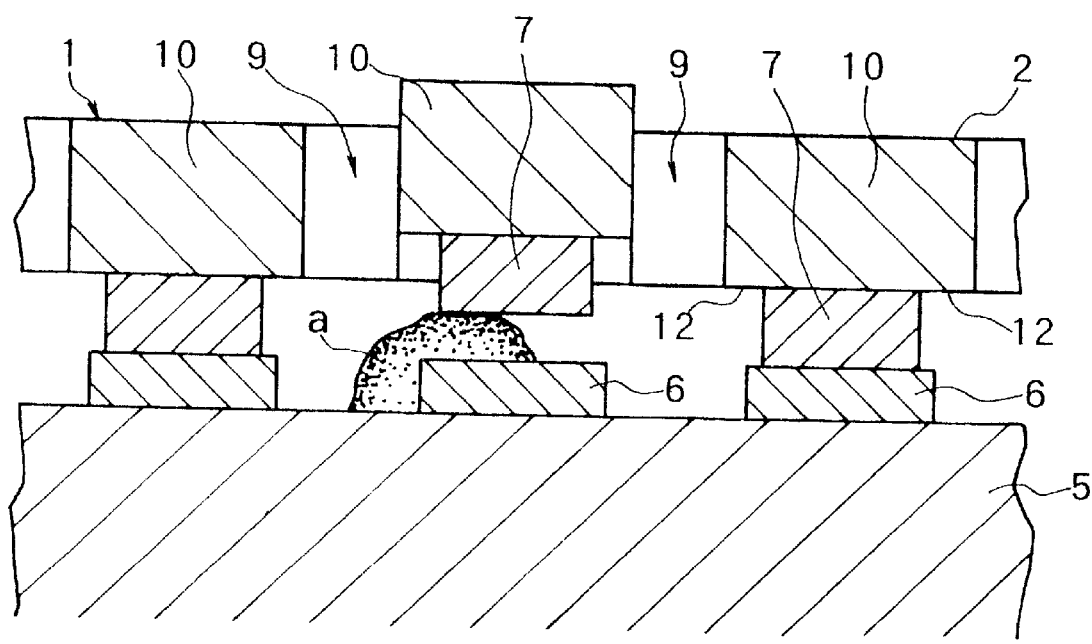
FIG. 7 is a cross sectional view showing pressure contacting state when a foreign matter exists on one of the pressure contact ends of any one of the contact probes according to the respective embodiments mentioned above.
Figure 8:
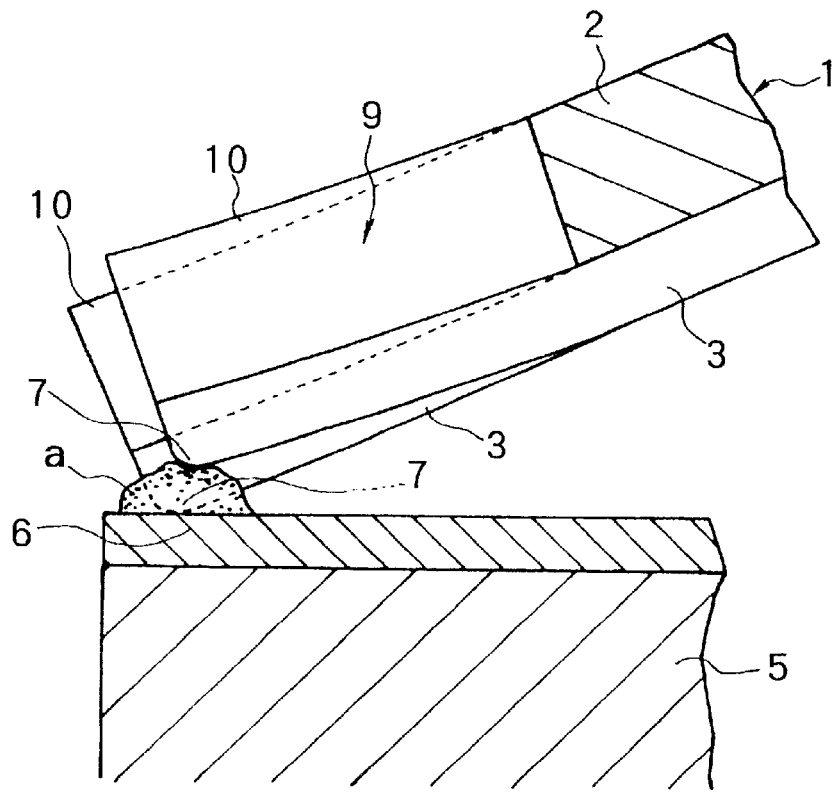
FIG. 8 is a vertical sectional view of a main portion of FIG. 7.

For example, as shown in FIGS. 7 and 8, in case foreign matter exists on one of the electrode pads 6, the contact ends 7 adjacent to the contact end 7 which is to be contacted with the specific electrode pad 6 on which the foreign matter exists are ensured a sufficient amount of flexure by the slots and as a result, a reliable pressure contact can be obtained.

As shown in FIGS. 4A and 5A, it is preferred that the width of each slot 9 does not reach the side surfaces of the adjacent contact ends 7. To accomplish this, flange portions 12 are formed in such a manner so as to project slightly from the edge portions of the insulative film defining the slots 7 (i.e., the edge portions of the insulative film along the side surfaces of each lead) and therefore, from the side surfaces of each contact end 7. As a result of the insulative flange portions 12, the contact ends 7 are protected such that when the contact ends 7 are slightly displaced sidewardly (adjacent direction) from each other, the insulative flanges 12 are abutted against each other, thereby effectively preventing the adjacent contact ends from forming a short circuit. The sideward displacement of the adjacent contact ends 7 relative to each other can be limited to an allowable range by mutual abutment of the insulative flange portions 12.

Figure 6:
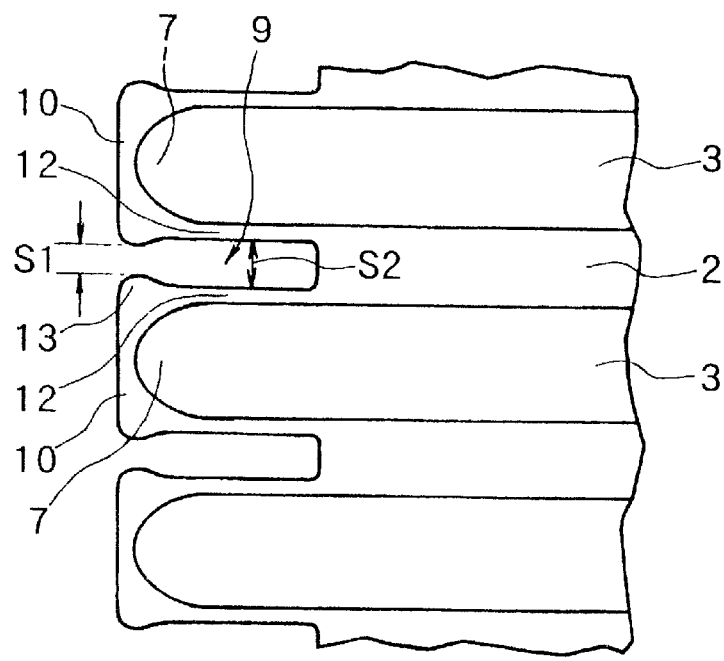
FIG. 6 is a plan view of a main portion of a contact probe according to still another embodiment of the present invention.

As means for positively obtaining the above result, as shown in FIG. 6, a width S1 of each slot 9 on the side of the contact ends 7 is designed to be smaller than a width S2 of each slot 9 on the internal side of the contact ends 7 and stoppers 13 are formed by the insulative flange portions 12 defining the smaller width S1. Due to a mutual abutment of the stoppers 13, the contact ends 7 are prevented from being overly displaced sidewardly and their correct contacting positions with the corresponding electrode pads 6 can be obtained.

Figure 9:
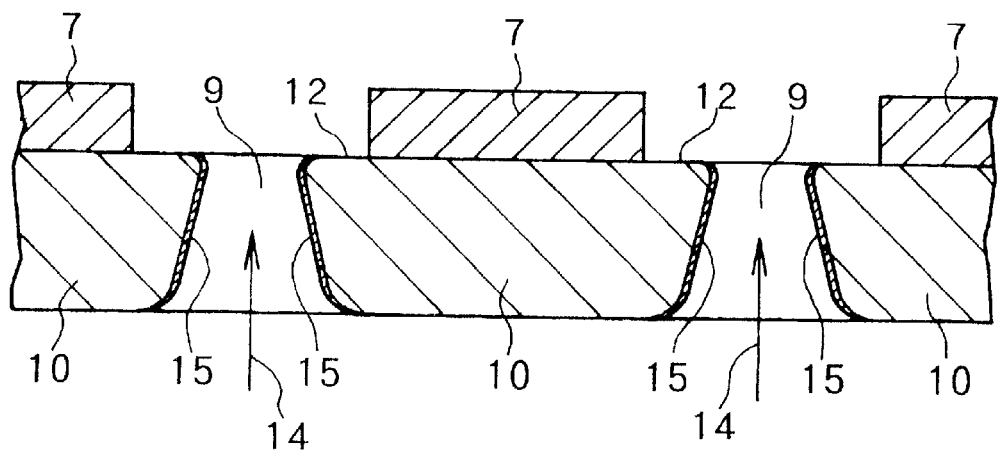
FIG. 9 is a cross sectional view of a main portion of any one of the contact probes according to the respective embodiments mentioned above, showing a machining example of slots.

As shown in FIG. 9, the slots 9 are formed by linearly melt cutting the insulative film 2 for example with a laser beam 14. By forming the slots 9 by linearly melt cutting the insulative film 2 with the use of the laser beam 14 or the like, a molten layer 15 of the insulative film 2 can be formed on an inner wall surface of each slot 9. The molten layers 15 serve to reinforce the slots 9, increase the strength of the inner wall surfaces of the slots 9 and effectively prevent the slots 9 from being torn. The laser beam 14 is preferably projected from the surface of the insulative film on the side opposite the side where the leads 3 are arranged. By doing so, the insulative flanges 12 can more easily be formed, the leads 3 can be prevented from being damaged, and a reliable contact with the insulative film 2 can be maintained.

Figure 10:
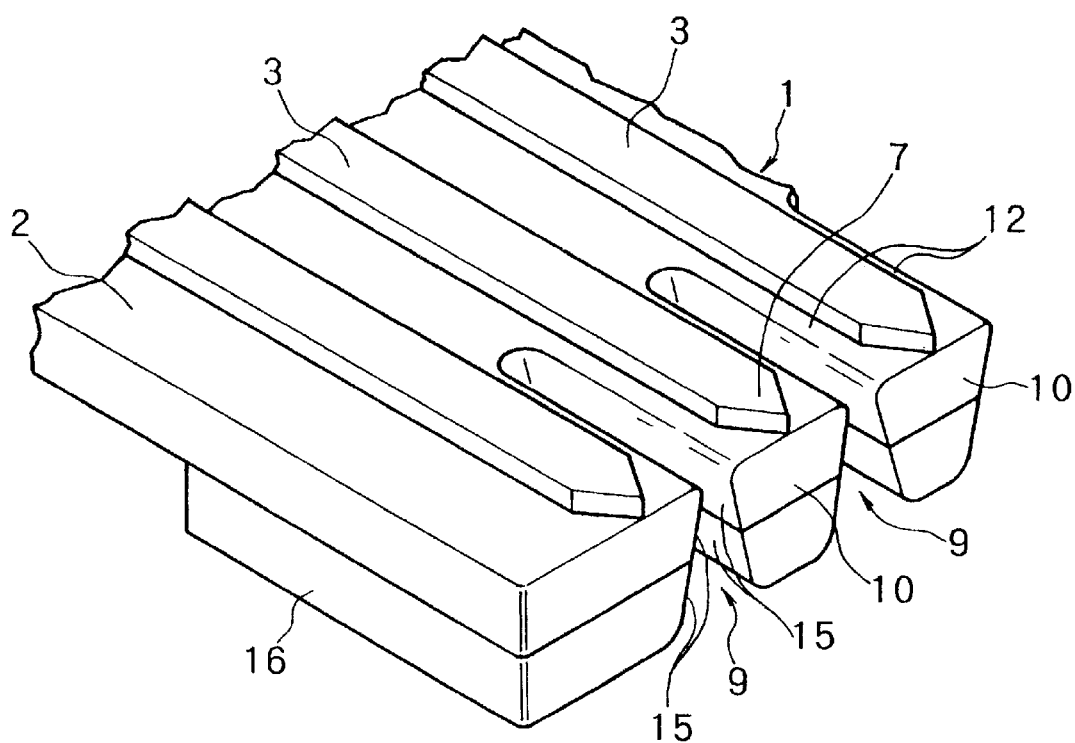
FIG. 10 is a perspective view of a main portion showing an example in which an insulative film in any one of the above-mentioned embodiments is of a multilayer structure.

As shown in FIG. 10, a reinforcing insulative film or metal foil 16, may be entirely or partly applied to the surface on the side of the contact ends 7, so that a multilayer structure is created. The slots 9 may extend over the entire length of the contact ends 7 or event to a part of the leads 3, such that the closed ends of the slots 9 are located on the attachment surfaces of the rigid blocks 4. The slots 9 may be formed by a cutter, or a suitable chemical agent, instead of the laser beam.

What is claimed is:

1. A contact probe comprising:
    an insulative film with first and second film ends opposite each other;
    a plurality of leads attached to said insulative film, said plurality of leads having first lead ends and pressure contact ends opposite each other;
    said insulative film having at least one slot located at said second film end, said at least one slot defining a plurality of film elements each having one of said plurality of leads located thereon; and
    said at least one slot having a width that decreases in a direction from said first film end towards said second film end for limiting lateral sideward displacement of said plurality of film elements, thereby preventing said plurality of leads from contacting each other.

2. The contact probe claimed in claim 1, wherein at least one of said pressure contact ends of said plurality of leads terminates at said second film end.

3. The contact probe claimed in claim 1, wherein at least one of said pressure contact ends of said plurality of leads terminates before said second film end.

4. The contact probe claimed in claim 1, wherein at least one of said pressure contact ends of said plurality of leads extends beyond said second film end.

5. The contact probe claimed in claim 1, wherein each of said plurality of film elements is wider than said one of said plurality of leads located thereon.

6. The contact probe claimed in claim 1, wherein each of said plurality of film elements extends laterally beyond said one of said plurality of leads located thereon.

7. A method for building a contact probe comprising:

attaching a plurality of leads to a first film surface of an insulative film having the first film surface, a second film surface, a first film end and a second film end; and creating at least one slot in the second film end of the insulative film which defines a plurality of film elements each having one of the plurality of leads located thereon such that the at least one slot is wider at the second film surface than at the first film surface, and the at least one slot has a width that decreases in a direction from said first film end towards said second film end for limiting lateral sideward displacement of said plurality of film elements, thereby preventing said plurality of leads from contacting each other.

8. The method for building a contact probe as claimed in claim 7, wherein said attaching of the plurality of leads includes attaching the plurality of leads such that the plurality of leads terminates at said second film end.

9. The method for building a contact probe as claimed in claim 7, wherein said attaching of the plurality of leads includes attaching the plurality of leads such that the plurality of leads terminates before said second film end.

10. The method for building a contact probe as claimed in claim 7, wherein said attaching of the plurality of leads includes attaching the plurality of leads such that the plurality of leads extends beyond said second film end.

11. The method for building a contact probe as claimed in claim 7, wherein said creating of the at least one slot further comprises creating the at least one slot such that each of the plurality of film elements is wider than the one of the plurality of leads located thereon.

12. The method for building a contact probe as claimed in claim 7, wherein said creating of the at least one slot further comprises creating the at least one slot such that each of the plurality of film elements extends laterally beyond the one of the plurality of leads located thereon.

13. The method for building a contact probe as claimed in claim 7, wherein said creating of the at least one slot further comprises creating the at least one slot with a laser.

* * * * *